United States Patent [19]

Kister

[11] Patent Number: 5,644,249

[45] Date of Patent: Jul. 1, 1997

[54] METHOD AND CIRCUIT TESTING APPARATUS FOR EQUALIZING A CONTACT FORCE BETWEEN PROBES AND PADS

[75] Inventor: January Kister, Menlo Park, Calif.

[73] Assignee: Probe Technology, Santa Clara, Calif.

[21] Appl. No.: 659,861

[22] Filed: Jun. 7, 1996

[51] Int. Cl.⁶ ............................... G01R 1/06; G01R 31/02
[52] U.S. Cl. .............................. 324/762; 439/66; 324/72.5
[58] Field of Search ........................................ 324/762, 758, 324/72.5; 439/436, 437, 438, 439, 440, 441, 67, 482, 66

[56] References Cited

U.S. PATENT DOCUMENTS

| | | | |
|---|---|---|---|
| 3,613,001 | 10/1971 | Hostetter | 324/758 |
| 4,322,682 | 3/1982 | Schadwill | 324/758 |
| 4,523,144 | 6/1985 | Okubo et al. | 324/758 |
| 4,567,433 | 1/1986 | Ohkubo et al. | 324/758 |
| 4,721,908 | 1/1988 | Driller et al. | 324/758 |
| 5,151,651 | 9/1992 | Shibata | 324/758 |
| 5,493,230 | 2/1996 | Swart et al. | 324/754 |
| 5,500,606 | 3/1996 | Holmes | 324/761 |

FOREIGN PATENT DOCUMENTS 0149776  5/1988  United Kingdom .

Primary Examiner—Vinh P. Nguyen
Assistant Examiner—Barry C. Bowser
Attorney, Agent, or Firm—Lumen Intellectual Property Services

[57] ABSTRACT

This invention presents a method and a mechanism for contacting a set of vertical probes of a circuit testing mechanism with a set of pads or bumps of a circuit under test. The vertical probes have a circular cross section, a tip portion of length L1 and a beam portion of length L2, such that the beam portion extends at a right angle to the tip portion. The tip portion is guided through a guide hole to the pads of the circuit under test and the beam portion secured by its end. In this geometry the contact force between the probe and the pad is described by the relation:

$$F = -E \cdot I \cdot \frac{D_V}{\left[ \frac{-1}{3} \cdot \frac{L2^3}{(L1+3 \cdot L2)} \cdot L1 - \frac{1}{4} \cdot \frac{L2^4}{(L1+3 \cdot L2)} \right]},$$

where $D_v$ is a vertical deflection of the probe, I is an area moment of inertia of the probe about its axis, and E is a Young's modulus of the probe. The tip length L1 and beam length L2 are selected for each of the vertical probes in such a way the contact force F in this relation is kept constant thus ensuring that the contact force F between the vertical probes and pads remains substantially equal.

18 Claims, 5 Drawing Sheets

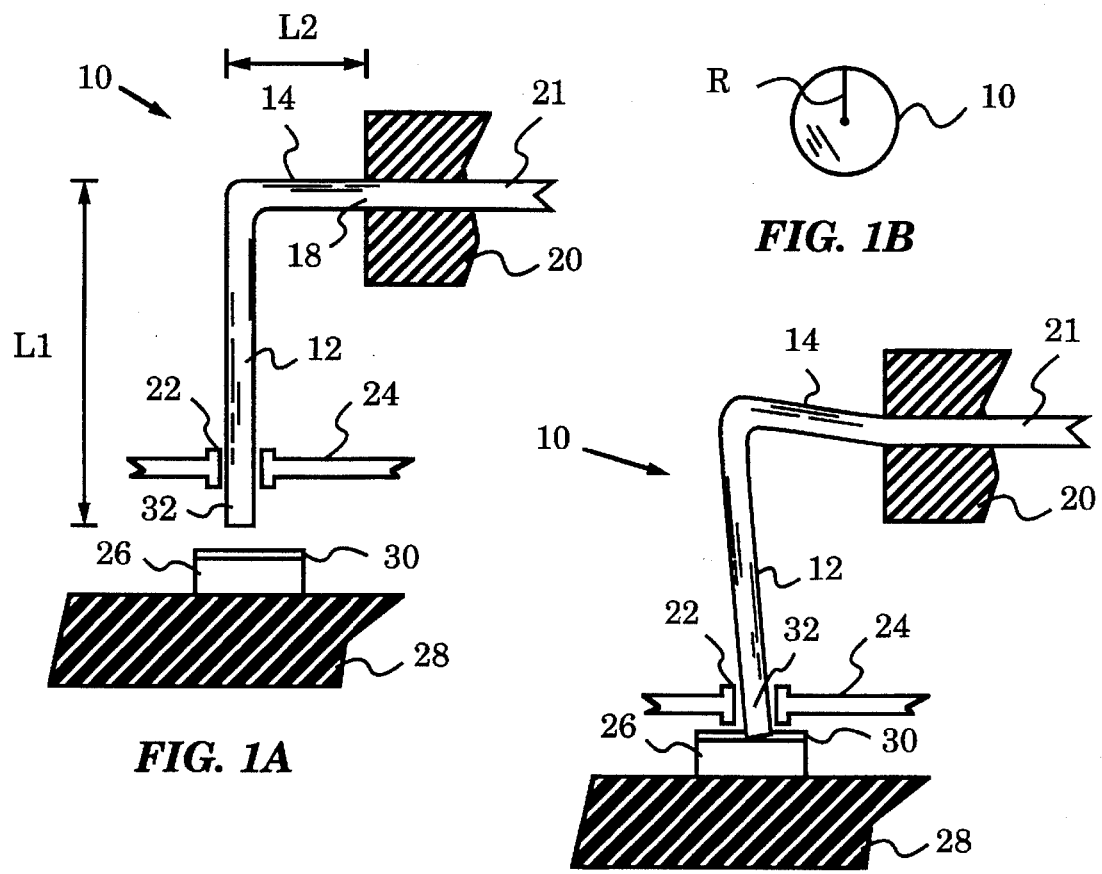
FIG. 1A  FIG. 1B  FIG. 2
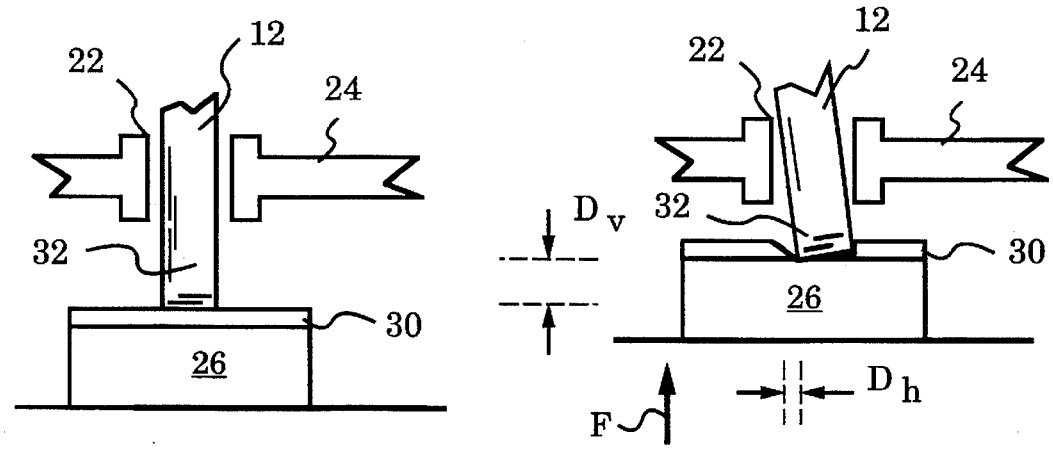
FIG. 3A  FIG. 3B

METHOD AND CIRCUIT TESTING APPARATUS FOR EQUALIZING A CONTACT FORCE BETWEEN PROBES AND PADS

FIELD OF THE INVENTION

The present invention relates to the field of testing electrical circuitry using testing devices with probes, and in particular to the design of such probes for achieving an equal force between a probes and pads of a circuit under test.

BACKGROUND OF THE INVENTION

Probe cards or testing devices are crucial for efficient manufacture of electronic circuits. These devices enable one to test and isolate defective circuits during production. Probe cards are frequently employed for functional testing of integrated circuits on wafers before cutting and mounting them inside an IC chip package. The arbitrary positions and enormous number of contact pads in such circuits, especially in the very large scale integration domain, impose stringent requirements on probe cards.

In particular, the probe card's contacting elements, probe needles or probes are affected by these conditions. The probe is repetitively driven against the pads on wafers under test or C4 solder bumps of electrical circuits. The distance by which the probes are moved towards the pads is commonly called overdrive. When driven against the pad the probe undergoes a deflection and its tip portion executes a lateral movement. The lateral scrubbing of the tip helps to remove an insulating oxide layer formed on the surface of the pad. This ensures proper electrical contact between the probe and the pad. Otherwise, the contact resistance between the probe and the pad would prevent the passage of electrical signals necessary for testing.

Furthermore, the repetitive nature of the testing process, geometrical unevenness of wavers, abrasion and fatigue of probe tips all affect the long-term probe performance. In particular, these factors affect the horizontal alignment or planarity of the probe tips and prevents the establishment of proper electrical contact between the probes and the corresponding pads. Large variance in planarity can not be overcome by increasing the overdrive since this would damage or even destroy the probes. Thus, planarity should be preserved at all times.

It has been recognized that one of the most effective ways to preserve planarity and ensure long life of probes is to ensure that the contact force F between the probes and the pads should be equalized. In other words, all probes should preferably experience the same contact force F with the pads.

Attempts have been made at solving these problems by suitable probe mounting and design. In U.S. Pat. No. 5,334,931 Clarke et al. present a probe formed from a molded plastic and equipped with a conductive contact tip. The body of the probe is cantilevered and designed such that the contact tip scrubs the surface of the pad of a device under test when overdrive is applied. Although this construction makes replacement of the conductive contact tip simple, the mounting arrangement is complicated, and planarity can not be ensured after many testing cycles. Moreover, this design does not ensure that the contact force F between the probes and the pads is equalized.

In U.S. Pat. No. 5,280,236 Takahashi et al. propose a probe made of a cobalt-based alloy containing at least 10 wt. % of chromium. The probe has a solder-enhanced metallic layer on its other end. These provisions ensure good scrubbing action due to the metallic coating on the tip and probe longevity due to the elasticity of the probe itself. Nonetheless, the application of repetitive stress disturbs probe planarity and deforms the probes.

Finally, in U.S. Pat. No. 4,980,638 Dermon et al. present a probe of controlled shape and dimensions. The shaft portion of the probes is tapered for easy replacement of probes. The probes are etched out of a sheet. There are no provisions to ensure longevity of the probes or sufficient planarity.

Subramanian describes a high density probe card for testing electrical circuits in U.S. Pat. No. 5,382,898. Although the structure of this device is well-adapted to high frequency ranges and high pad densities it does not address the issue of equalizing the contact force.

Ueno et al. in U.S. Pat. No. 5,491,427 teaches how to prolong the life of a probe by adjusting the alignment of the probe electrodes and the device to be probed. In particular, these inventors focus on various geometrical arrangements of the probes. The preferable arrangement of probes, according to their teaching, is in columns. In addition, Ueno et al. accept a certain fail ratio of probes by providing a novel grid pattern of electrical interconnections which allow one to continue probing while avoiding the failed probes. While this approach is advantageous from many points of view, it is not directed at the root problem of contact force equalization. Instead, defective and failed probes are shorted out of the electrical circuitry instead, thus treating the symptoms rather than the underlying problem.

All of the above-mentioned prior art probes suffer from long-term stress fatigue and lack of sufficient equalization of the contact force between the probes and pads of the circuit under test. Consequently, planarity is lost and, in more severe cases, probes break under stress concentrating at their attachment or support points.

OBJECTS AND ADVANTAGES OF THE INVENTION

In view of the above, it is a primary object of the present invention to provide a method for maintaining the contact force F between probes and pads substantially equal when the pads of a circuit under test are driven against the probes. In particular, it is an object of the invention to demonstrate a method for probe design and mounting to achieve equalization of the contact force F. Uniform contact force F will prevent the loss of planarity, breaking of probes, and deformations due to fatigue. Furthermore, probes designed according to the method of the invention have a longer life.

It is another object of the invention to provide a circuit testing mechanism with probes designed according to the method of the invention.

Yet another object of the invention is to deliver a support structure designed to cooperate with probe design according to the invention.

Still another object of the invention is to ensure that the method and apparatus are simple in construction and cost-effective in use.

These and other objects and advantages will become more apparent after consideration of the ensuing description and the accompanying drawings.

SUMMARY OF THE INVENTION

These objects and advantages are attained by the method of the invention by selecting suitable probe dimensions, using a vertical probe geometry, and mounting the probes in appropriate ways. In particular, the method for contacting a set of vertical probes belonging to a circuit testing mechanism with a set of pads or bumps of a circuit under test according to the invention provides for each vertical probe to be arranged to contact a corresponding pad and for the vertical probe to have a circular cross section. The vertical probe also has a tip portion of tip length L1 and a beam portion of beam length L2. The beam portion extends at a right angle to the tip portion. Through suitable choice of material, a Young's modulus E is selected for the vertical probe. The beam portion of the vertical probe has a free end and a certain area moment of inertia I about its axis.

The method of the invention calls for securing the end of the beam portion to a block of the circuit testing mechanism. In a preferred embodiment this block is made of a ceramic or other highly insulating material stacked in layers. The tip portion of the probe is passed through a guide hole and aligned with the corresponding pad which is to be contacted during testing. In this way the tip portion is free to slide vertically in the guide hole and the probe is free to undergo a vertical deflection $D_v$.

An important step in the method is to determine a contact force F to be applied between the tip portion and the corresponding pad. In particular, due to the vertical probe design and passage of the tip portion through the guide hole, the contact force F, within the elastic limits of the probe material, is governed by the following relation:

$$F = -E \cdot I \cdot \frac{D_V}{\left[ \frac{-1}{3} \cdot \frac{L2^3}{(L1+3 \cdot L2)} \cdot L1 - \frac{1}{4} \cdot \frac{L2^4}{(L1+3 \cdot L2)} \right]},$$

Thus, tip length L1 and beam length L2 are selected for each of the vertical probes in such a way the contact force F in this relation is kept constant. When the set of vertical probes is driven against the set of pads the contact force between the pads and the probes will remain substantially equal. In other words, the contact force F between each probe and pad will be approximately the same during the entire testing or contacting cycle.

In a preferred embodiment of the method the set of vertical probes is subdivided into probe groups $G_i$, where i=1 to n. This is done in such a way that the tip length L1 and beam length L2 of the members of each group are the same. In other words, the probes are separated into groups based on lengths L1 and L2. Furthermore, each group $G_i$ is mounted in the block at a prescribed level. The group containing probes with the shortest beam length L2 will be mounted at the highest level and the probes with the longest beam length L2 will be mounted at the lowest level. The other probe groups will be mounted at intermediate levels.

In a preferred embodiment the groups of probes are separated by vertical spacers made of an insulating material, e.g., a ceramic. The spacers can be staggered to provide for sufficient separation between probes belonging to different groups. Also, the spacers are preferably of equal thickness such that the vertical distance between adjacent groups is the same. In other words, the probe groups are mounted in equal vertical increments.

The method of the invention also provides for varying the radius of the vertical probe to thus change the area moment of inertia I in the relation describing the contact force F. Thus, preservation of equalized contact force F can be ensured by changing a third parameter in addition to tip length L1 and beam length L2.

Finally, the invention also provides for a circuit testing mechanism which puts the method of the invention into practice. The mechanism has a block for securing the end of the vertical probe, a guide hole for the tip of each probe to ensure proper alignment of each probe with each pad, and a driving mechanism. The driving mechanism is used to drive probes against the pads while the contact force F is maintained substantially equal between all pads and probes.

Preferably, the block is made of an insulating material, e.g., a ceramic. Furthermore, the block is preferably made up of layers of equal thickness and the probe groups are mounted between these layers. The block can be mounted directly on a printed circuit board.

Finally, the guide holes for the tip portions of each probe can be lubricated. Such lubrication, preferably consisting of a non-migrating polymer-based lubricant, eliminates stiction between the probes and the guide holes. This ensures proper vertical deflection $D_v$ upon application of the contact force F. The element in which the guide holes are made is usually a guide plate or an analogous element which can be positioned above the circuit under test.

The invention will now be described in detail with reference to the attached drawing figures.

DESCRIPTION OF THE FIGURES

FIG. 1A is a side view of a vertical probe according to the invention.

FIG. 1B is a cross section of the probe of FIG. 1A.

FIG. 2 is a side view of the vertical probe of FIG. 1 in contact with a pad.

FIG. 3A is an enlarged view of a tip portion coming in contact with a pad.

FIG. 3B is an enlarged view of the tip of FIG. 3A under full vertical and lateral deflection.

DETAILED DESCRIPTION

Figure 4:
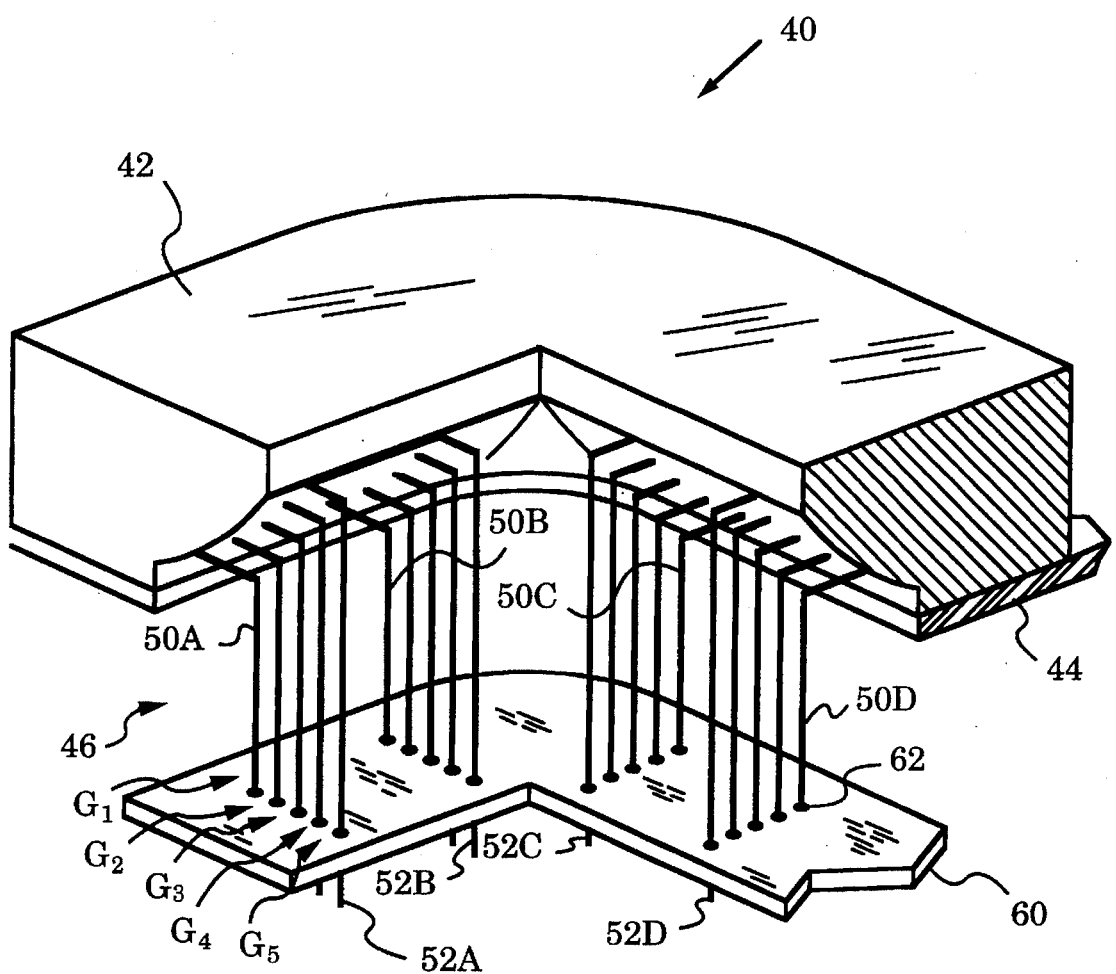
FIG. 4 is a three dimensional view of a part of a circuit testing mechanism according to the invention.

A vertical probe 10 according to the invention is illustrated in FIG. 1A. As shown, probe 10 has a tip portion 12 and a beam portion 14. A tip length L1 and a beam length L2 are indicated. An end 18 of beam portion 14 is secured in a block 20. The material of block 20 is an electrical insulator. This provision ensures that a shaft 21 continuing from end 18, which is defined at the point where beam portion 14 enters block 20, can be used without any insulation to transmit electrical signals to and from probe 10. Preferably, the electrical insulator is a ceramic. This is because ceramics exhibit a high degree of structural stability.

The lower part of tip portion 12 passes through a guide hole 22 in a guide plate 24. Hole 22 is positioned directly above a pad 26 of an electrical circuit 28 under test. Although the specification will refer to element 26 as a pad, it is understood that pad 26 may also be a solder bump, e.g., a C4 bump. Pad 26 is covered by an oxide layer 30. The presence of oxide layer 30 on pad 26 is due to regular oxidation processes. As is well-known in the art, oxide layer 30 has to be scrubbed off by a contact end 32 of tip portion 12 to guarantee proper electrical contact between probe 10 and pad 26.

Only a small portion of the electrical circuit 28 is shown in the drawing. It is understood that circuit 28 can be located on any substrate and can include any electrical components, assemblies and connections requiring testing.

Hole 22 serves to align tip portion 12 of probe 10 with pad 26. Proper alignment is essential for proper functioning and scrubbing of oxide layer 30. In particular, in FIG. 1 tip portion is aligned slightly off-center away from block 20 in anticipation of the scrubbing movement, i.e., a horizontal deflection $D_h$, of contact end 32. Since horizontal deflection $D_h$ is typically on the order of 1 mil or less, the off-center alignment only has to be precise when pad 26 is very small. Also tip portion 12 is free to slide vertically in guide hole 22, such that probe 10 can undergo a vertical deflection $D_v$.

According to the method of the invention the cross section of probe 10 is circular, as indicated in FIG. 1B. A radius R defines the cross sectional area of probe 10. Referring back to FIG. 1A, beam portion 14 is shown bent at a right angle to tip portion 12. Entire probe 10 is made of the same material, e.g. a cobalt-based alloy or another suitable electrical conductor. Thus, a Young's modulus E of probe 10 is well-defined and constant. Also, an area moment of inertia I of probe 10 about its axis is well-defined because probe 10 has a circular cross section and is made of a homogeneous material. In particular, area moment of inertial I of probe 10 is analogous to that of a frame with one end fixed (end 18).

FIG. 2 shows probe 10 being driven against pad 26. The overdrive distance typically ranges between 3 and 6 mil. Contact end 32 approaches pad 26, establishes contact with it, and, under the influence of a contact force F, scrubs away a portion of oxide layer 30. Typically the scrubbing motion is very short, on the order of 1 mil or less. This is sufficient to remove oxide layer 30 and any impurities (not shown) to guarantee that electricity can flow between probe 10 and pad 26. In some cases, particularly if contact force F is large and said contact end 32 is sufficiently small to deliver a high pressure, the scrubbing motion is minimized. Instead, contact end 32 breaks through oxide layer 30 in a vertical, piercing motion.

Contact force F also induces a deformation of probe 10. As is well-known, contact force F must not exceed the elasticity limit of probe 10. The deflected shape of probe 10 can be characterized in terms of vertical deflection, $D_v$, and a horizontal deflection, $D_h$. The latter corresponds to the extent of the scrubbing movement.

FIGS. 3A and 3B better illustrate the vertical and horizontal deflections, $D_v$ and $D_h$, defined with respect to probe tip 12 or its contact end 32. In FIG. 3A contact end 32 of tip 12 is just touching the surface of oxide layer 30. This is the point at which contact force F is applied between probe 10 and pad 26. In FIG. 3B contact force F has caused contact end 32 to scrub and break through oxide layer 30. Vertical and horizontal deflections, $D_v$ and $D_h$, of probe tip 12 are indicated. Usually, vertical deflection $D_v$ is maintained between 1 to 3 mil, or more, but in any case considerably below the elastic limit of probe 10. Meanwhile, horizontal deflection $D_h$ corresponds to the scrubbing length, i.e., about 1 mil or less.

As mentioned above, probe 10 can be treated as a frame with end 18 fixed at block 20. Thus, contact force F is governed by the following relation:

$$F = -E \cdot I \cdot \frac{D_V}{\left[\frac{-1}{3} \cdot \frac{L2^3}{(L1+3 \cdot L2)} \cdot L1 - \frac{1}{4} \cdot \frac{L2^4}{(L1+3 \cdot L2)}\right]},$$

It follows from this relation that for a given vertical deflection $D_v$, contact force F acting on probe 10 can be chosen the same through a suitable choice of tip length L1 and beam length L2. That is because at any given vertical deflection $D_v$, lengths L1 and L2 are the only variables influencing the value of contact force F. In other words, at any given vertical deflection $D_v$ of tip portion 12, contact force F is a function of lengths L1 and L2 only.

Figure 6:
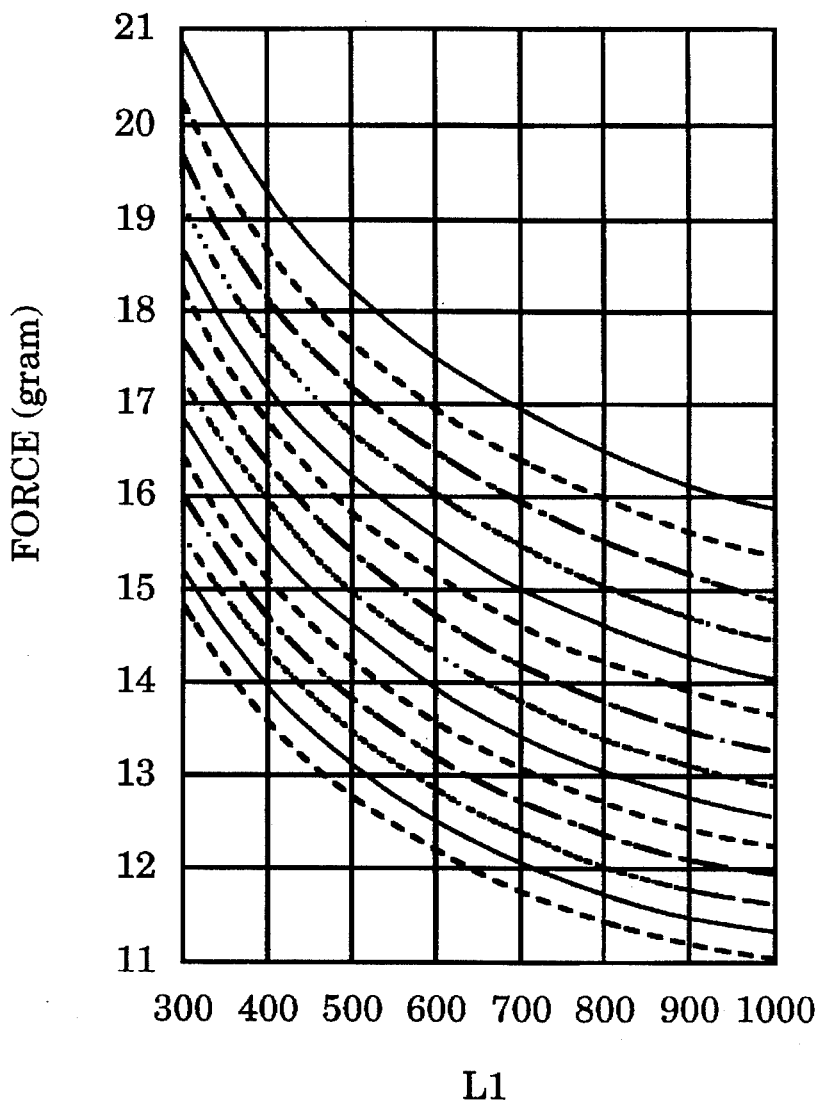
FIG. 6 is a graph illustrating the relationship between contact force F, beam length L2 and tip length L1.
Figure 7:
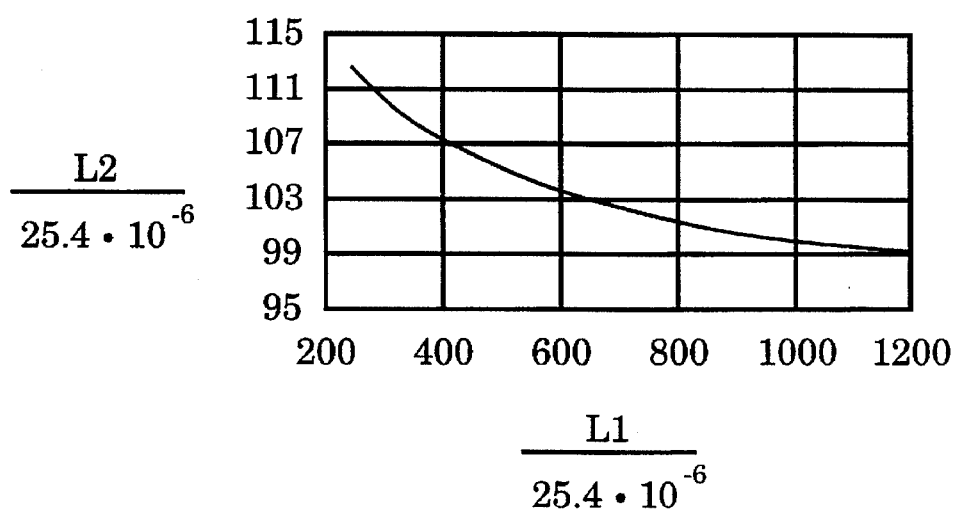
FIG. 7 is a graph illustrating the relationship between beam length L2 and tip length L1 at constant parameters.
Figure 8:
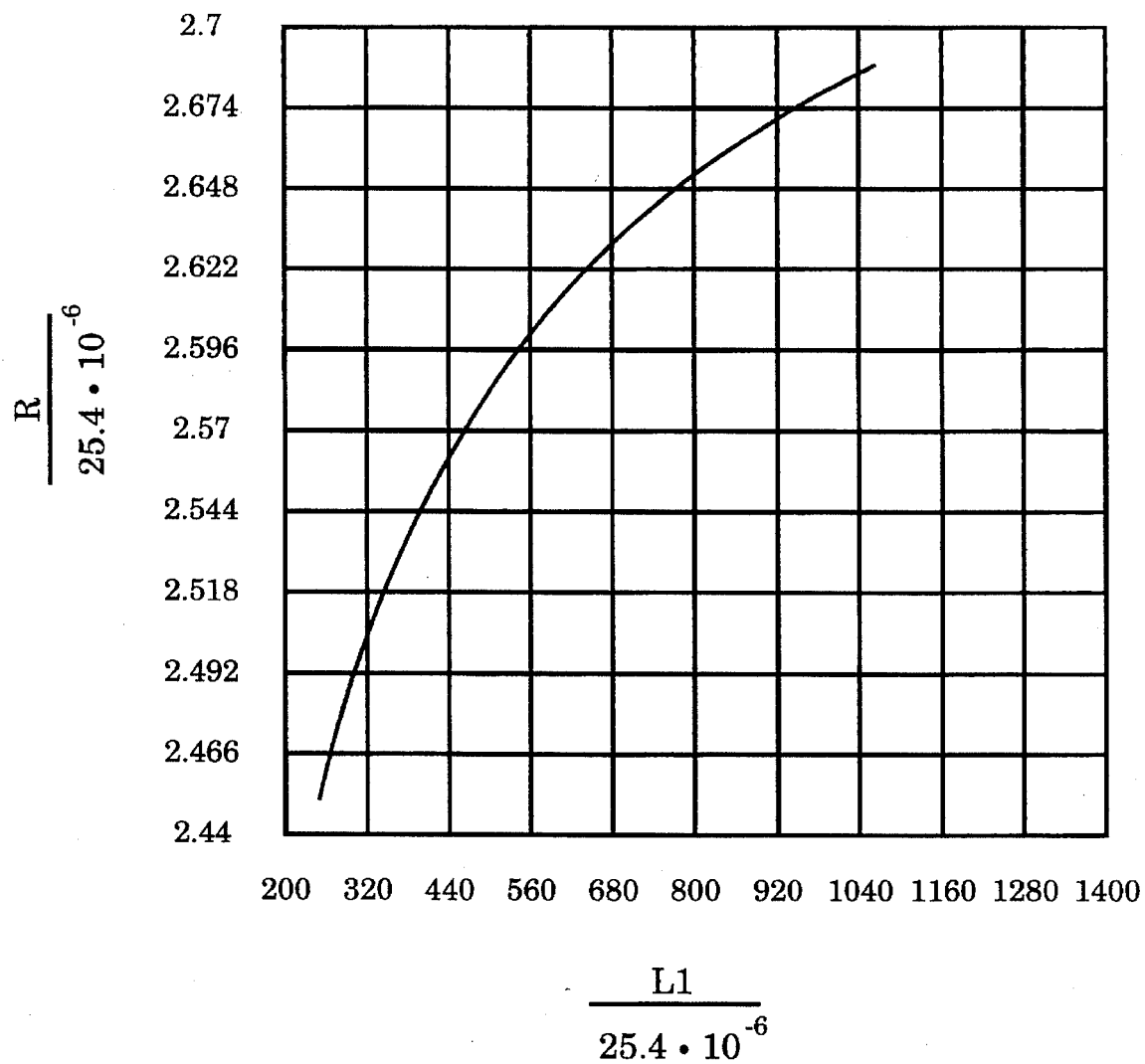
FIG. 8 is a graph showing the relationship between probe radius R and tip length L1 at constant parameters.

FIG. 6 shows the relationship between contact force F and tip length L1 for 14 values of beam length L2 at a constant vertical deflection $D_v$. The values for length L2 range from 0.111 in. to 0.098 in. by 0.001 in. increments. The topmost curve corresponds to beam length L2 of 0.111". As can be seen, many pairs of values for lengths L1 and L2 will produce the same contact force F. Consequently, according to the method of the invention, it is these pairs of values which are chosen for tip and beam lengths, L1 and L2. In fact, the graph in FIG. 7 is a locus of pairs of values for lengths L1 and L2 according to the method of the invention.

A practical embodiment of a circuit testing apparatus 40 for practicing the method of the invention is shown in FIG. 4. In particular, a portion of apparatus 40 shown in FIG. 4 has a block 42 made of a ceramic material. Block 42 rests directly on a printed circuit board 44. This is advantageous, because a set of vertical probes 46 can thus be easily connected to any board circuitry behind block 42 on board 44 (not shown).

Set of vertical probes 46 is further subdivided into five groups, $G_i$, i=1 ... 5, of vertical probes of same lengths L1 and L2. In fact, a first group, $G_1$, consists of four probes 50A, 50B, 50C and 50D having the same lengths L1 and L2. Probes 50A, 50B, 50C and 50D belonging to first group $G_1$ have the longest beam length L2. For this reason, they are mounted at a lowest level in block 42. In other words, probes of group $G_1$ are mounted closest to a guide plate 60. Meanwhile, a last group $G_5$, consists of four probes 52A, 52B, 52C and 52D with the shortest beam length L2. Member probes of group $G_5$ are thus mounted at the highest level in block 42. All other groups, $G_2$, $G_3$ and $G_4$ are mounted at intermediate levels between groups $G_1$ and $G_5$. Probes of all groups are guided via guide holes 62 in plate 60 to produce proper alignment with a test circuit below (not shown).

Figure 5:
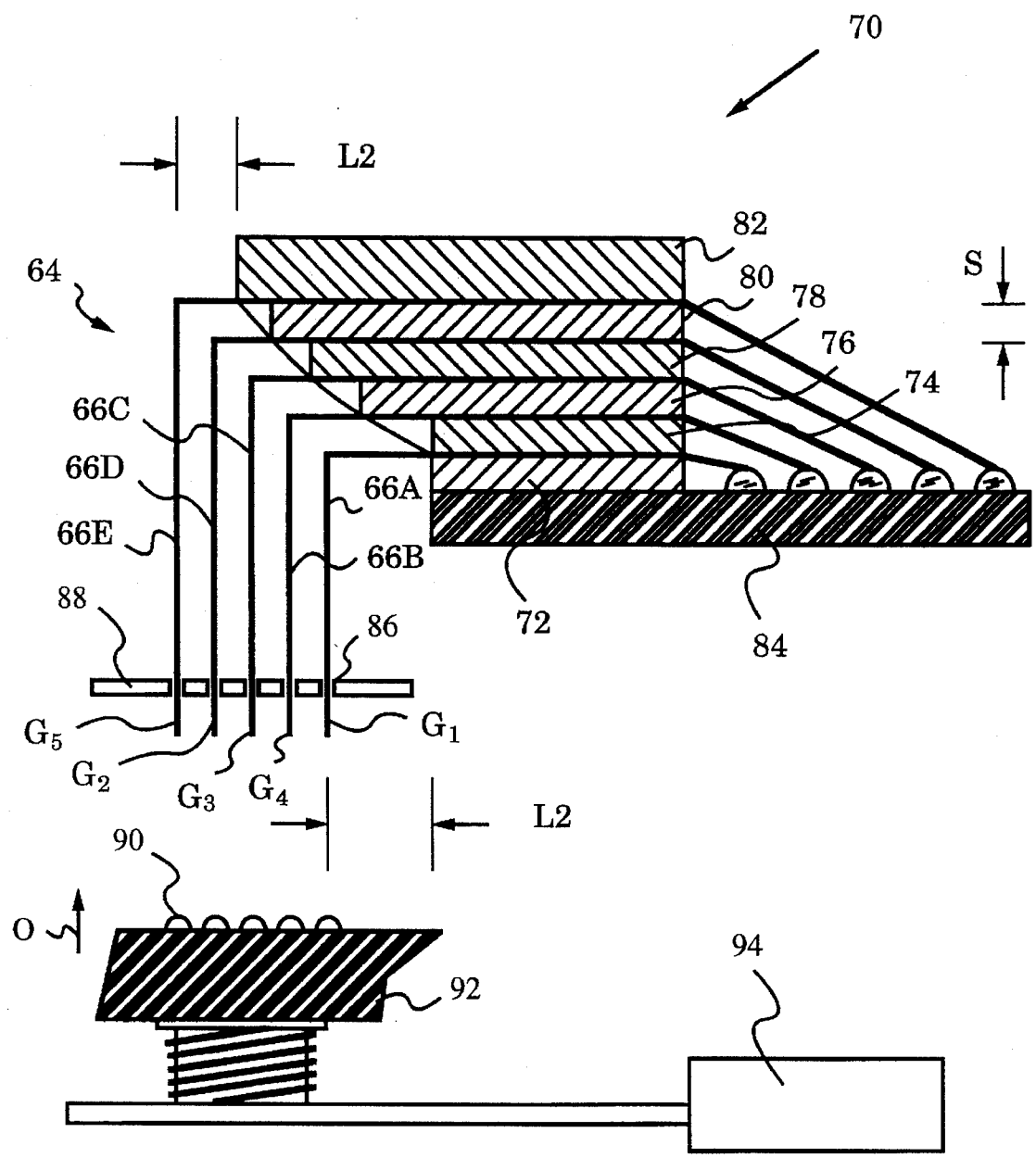
FIG. 5 is a more detailed cross section of the circuit testing mechanism of FIG. 4.

The side view of FIG. 5 shows a preferred embodiment, which involves a few modifications to the practical embodiment of FIG. 4. Here, a set of vertical probes 64 is subdivided into five groups $G_1 \ldots G_5$. In the side view of FIG. 5 only one of vertical probes 66A, 66B, 66C, 66D and 66E belongs to each group, $G_1 \ldots G_5$, as shown. Again, probe 66A, which has the longest beam length L2 and belongs to group $G_1$ is mounted at the lowest level in a block 70. Similarly, probe 66E of group $G_5$ has the shortest beam length L2 and is mounted at the highest level.

Block 70 is itself composed of a number of spacers or insulating layers 72, 74, 76, 78, 80 and 82. All of these insulating layers are preferably made of ceramic. Alternating hatching is used to better visualize each layer. Preferably all layers are of equal thickness. In this manner the vertical distance or spacing S between successive groups of probes is kept constant, since the shafts of probes 66A, 66B, 66C, 66D and 66E are guided to the other side of block 70 between insulating layers 72, 74, 76, 78, 80 and 82. There, electrical connecting portions of each probe are soldered as shown to a printed circuit board 84 on which block 70 is directly mounted.

Furthermore, insulating layers 72, 74, 76, 78, 80 and 82 are staggered according to beam lengths L2 of probes 66A, 66B, 66C, 66D and 66E. To ensure proper hold on the ends of probes 66A, 66B, 66C, 66D and 66E the interstices between the insulating layers are filled in, preferably with the same ceramic material, as shown. The filled in portions of block 70 are not hatched. The staggering of layers 72, 74, 76, 78, 80 and 82 allows one to adjust the distance between tip portion of probes 66A, 66B, 66C, 66D and 66E. In the preferred embodiment the distance between adjacent probes is constant. This is practical for passing the tip portions of the probes through guide holes 86 in a guide plate 88.

As before, guide holes 86 serve to align tip portions of probes 66A, 66B, 66C, 66D and 66E with pads 90, in this case in the form of solder bumps, positioned on a circuit under test 92. Preferably, the sides of holes 86 are slick to prevent stiction between the probes and guide plate 88. Any appreciable friction or stiction in holes 86 should be avoided since it could adversely affect the method and mechanism of the invention. In particular, stiction could destroy the approximation that the probe can be treated as frames fixed at block 70. The most efficient way of avoiding this problem is through lubrication. In the preferred embodiment the sides of holes 86 are wetted with a non-migrating polymer-based lubricant. Substances of this type are well-known to those skilled in the art.

Circuit under test 92 is positioned on a chuck 94 which can generate the necessary overdrive along the direction of arrow O. The distance by which circuit 92 is separated from probes 66A, 66B, 66C, 66D and 66E is highly exaggerated.

In this manner, the method and mechanism according to the invention maintain contact force F between probes and pads substantially equal at all times during a testing cycle. Uniform contact force F prevents the loss of planarity, breaking of probes, and deformations due to fatigue. Thus, probes used according to the method of the invention have a long service life. The construction of the mechanism for practicing the method of invention is simple and cost-effective, especially since the elements in which the probes are secured can be mounted directly on a printed circuit board.

It will be clear to one skilled in the art that the above embodiments may be altered in many ways without departing from the scope of the invention. Accordingly, the scope of the invention should be determined by the following claims and their legal equivalents.

What is claimed is:

1. A method of contacting a set of vertical probes belonging to a circuit testing mechanism with a set of pads of a circuit under test, each vertical probe of said set of vertical probes being arranged to contact a corresponding pad of said set of pads, said vertical probe having a circular cross section, a tip portion of tip length L1 and a beam portion of beam length L2, said beam portion extending at a right angle to said tip portion, said beam portion having an end, said vertical probe further having a Young's modulus E and a predetermined Area moment of inertia I about said end, said method comprising the following steps:

a) securing said end to a block of said circuit testing mechanism;

b) passing said tip portion through a guide hole to align said tip portion with said corresponding pad, such that said tip portion is free to slide vertically in said guide hole and said vertical probe is free to undergo a vertical deflection $D_v$;

c) determining a contact force F to be applied between said tip portion of said vertical probe and said corresponding pad, said contact force F being governed by a relation:

$$F = -E \cdot I \cdot \frac{D_V}{\left[ \frac{-1}{3} \cdot \frac{L2^3}{(L1+3 \cdot L2)} \cdot L1 - \frac{1}{4} \cdot \frac{L2^4}{(L1+3 \cdot L2)} \right]},$$

d) selecting a tip length L1 and a beam length L2 for each of said vertical probes to keep said contact force F in said relation constant;

e) driving said set of vertical probes against said set of pads, whereby said contact force F between said set of vertical probes and said set of pads remains substantially equal.

2. The method of claim 1, further comprising the step of subdividing said set of vertical probes into a number of probe groups $G_i$, where i=1 to n, such that said tip length L1 and said beam length L2 of each vertical probe in one of said probe groups $G_i$ is the same.

3. The method of claim 2, wherein each one of said probe groups $G_i$ is mounted in said block at a predetermined level.

4. The method of claim 3, wherein each one of said probe groups $G_i$ mounted at said predetermined level is separated from the remaining probe groups $G_i$ by insulating layers.

5. The method of claim 3, wherein a first probe group $G_1$ containing said vertical probes for which said beam length L2 is shortest, is mounted at a highest level.

6. The method of claim 3, wherein a last probe group $G_n$ containing said vertical probes for which said beam length L2 is longest, is mounted at a lowest level.

7. The method of claim 2, wherein said probe groups $G_i$ are mounted in said block in a staggered arrangement.

8. The method of claim 2, wherein said probe groups $G_i$ are mounted in said block at equal vertical increments.

9. The method of claim 1, wherein a radius R of said vertical probe is selected to alter said predetermined Area moment of inertia I to keep said contact force F in said relation constant.

10. A circuit testing mechanism for contacting a set of vertical probes with a set of pads of a circuit under test, each vertical probe of said set of vertical probes being arranged to contact a corresponding pad of said set of pads, said vertical probe having a circular cross section, a tip portion of tip length L1 and a beam portion of beam length L2, said beam portion extending at a right angle to said tip portion, said beam portion having an end, said vertical probe further having a Young's modulus E and a predetermined area moment of inertia I about its axis, said circuit testing mechanism comprising:

a) a block for securing said end;

b) a guide hole for passing said tip portion therethrough to align said tip portion with said corresponding pad, such that said tip portion is free to slide vertically in said guide hole and said vertical probe is free to undergo a vertical deflection $D_v$;

c) a driving means for driving said set of vertical probes against said set of pads, such that a contact force F applied between said tip portion of said vertical probe and said corresponding pad is governed by a relation:

$$F = -E \cdot I \cdot \frac{D_V}{\left[ \frac{-1}{3} \cdot \frac{L2^3}{(L1 + 3 \cdot L2)} \cdot L1 - \frac{1}{4} \cdot \frac{L2^4}{(L1 + 3 \cdot L2)} \right]},$$

and said contact force F between said set of vertical probes and said set of vertical pads remains substantially equal when said tip length L1 and said beam length L2 satisfy said relation for a constant value of said contact force F.

11. The circuit testing mechanism of claim 10, wherein said block comprises an insulating material.

12. The circuit testing mechanism of claim 11, wherein said insulating material is a ceramic.

13. The circuit testing mechanism of claim 10, wherein said set of vertical probes is subdivided into a number of probe groups $G_i$, where i=1 to n, such that said tip length L1 and said beam length L2 of each vertical probe in one of said probe groups $G_i$ is the same, and said probe groups $G_i$ are separated from each other by insulating layers.

14. The circuit testing mechanism of claim 13, wherein said insulating layers are made of a ceramic.

15. The circuit testing mechanism of claim 13, wherein said insulating layers have equal thickness.

16. The circuit testing mechanism of claim 10, wherein said block is mounted directly on a printed circuit board.

17. The circuit testing mechanism of claim 10, wherein said guide hole is made in a guide plate.

18. The circuit testing mechanism of claim 10, wherein said guide hole comprises sides, and said sides are lubricated.

* * * * *